United States Patent
Li (10) Patent No.: US 11,990,483 B2
(45) Date of Patent: May 21, 2024

(54) ARRAY SUBSTRATE AND MANUFACTURING METHOD THEREOF

(71) Applicant: Shenzhen China Star Optoelectronics Semiconductor Display Technology Co., Ltd., Guangdong (CN)

(72) Inventor: Ziran Li, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/438,956

(22) PCT Filed: Aug. 6, 2021

(86) PCT No.: PCT/CN2021/111115
§ 371 (c)(1),
(2) Date: Sep. 14, 2021

(87) PCT Pub. No.: WO2023/004869
PCT Pub. Date: Feb. 2, 2023

(65) Prior Publication Data
US 2024/0030239 A1    Jan. 25, 2024

(30) Foreign Application Priority Data
Jul. 29, 2021    (CN) .......................... 202110862459.2

(51) Int. Cl.
*H01L 27/12* (2006.01)
(52) U.S. Cl.
CPC ...... *H01L 27/1248* (2013.01); *H01L 27/1259* (2013.01)

(58) Field of Classification Search
None
See application file for complete search history.

(56) References Cited

U.S. PATENT DOCUMENTS

| | | | |
|---|---|---|---|
| 11,532,648 B2* | 12/2022 | Nie | H01L 27/1262 |
| 2015/0243681 A1* | 8/2015 | Sung | H01L 27/124 |
| | | | 438/151 |

FOREIGN PATENT DOCUMENTS

| | | |
|---|---|---|
| CN | 104393051 | 3/2015 |
| CN | 105206678 | 12/2015 |
| CN | 110993695 | 4/2020 |
| CN | 111293127 | 6/2020 |
| CN | 111584516 | 8/2020 |
| CN | 112420741 | 2/2021 |
| CN | 112864254 | 5/2021 |
| JP | 07-115205 | 5/1995 |

* cited by examiner

*Primary Examiner* — Bo B Jang (57) ABSTRACT

An embodiment of the present application discloses an array substrate and a manufacturing method thereof. The array substrate includes an underlay, an active layer, a gate electrode insulation layer, and a metal layer. A first through hole, second through holes, third through holes, and a fourth through hole are defined in the gate electrode insulation layer. The second through holes and third through holes are arranged at intervals such that partial regions of the active layer are shielded by the gate electrode insulation layer to prevent them from corrosion of an etching solution to guarantee a normal electrical connection of the active layer and a source electrode and a drain electrode and improve a yield rate of the array substrate.

20 Claims, 8 Drawing Sheets

ARRAY SUBSTRATE AND MANUFACTURING METHOD THEREOF

RELATED APPLICATIONS

This application is a National Phase of PCT Patent Application No. PCT/CN2021/111115 having International filing date of Aug. 6, 2021, which claims the benefit of priority of Chinese Patent Application No. 202110862459.2 filed on Jul. 29, 2021. The contents of the above applications are all incorporated by reference as if fully set forth herein in their entirety.

FIELD AND BACKGROUND OF THE INVENTION

The present application relates to a field of displays, especially to an array substrate and a manufacturing method thereof.

At present, manufacturing processes and structures of a top gate type thin film transistor (TFT) are complicated, and the TFT has a greater number of layers. Each additional array process added not only increases time cost and material cost, but also reduces yield rate. Therefore, reducing processes is necessary and a new process disposing a gate electrode, a source electrode, and a drain electrode in a same layer is proposed. Compared to the top gate type TFT, a TFT with the gate electrode, the source electrode, and the drain electrode disposed in the same layer has one fewer process of a metal formation process, a lithography process, an etching process, and a gate electrode insulation layer, and can achieve a cost lowering effect. Therefore, the TFT disposing the gate electrode, the source electrode, and the drain electrode in the same layer has been applied extensively in display devices.

In the TFT with the gate electrode, the source electrode, and the drain electrode disposed in the same layer, because all of the gate electrode, the source electrode, and the drain electrode are metal copper of a low impedance, they cannot be formed by a dry etching process. When forming the gate electrode, the source electrode, and the drain electrode by a wet etching process, metal etching solution would contact an active layer and result in corrosion of the active layer to affect electrical conduction between the source and the drain electrodes and the active layer and lower a device performance and yield rate of the TFT.

Therefore, how to prevent the metal etching solution from affecting the electrical conduction between the source and the drain electrode and the active layer is a difficulty to be overcome by display panel manufacturers.

SUMMARY OF THE INVENTION

An embodiment of the present application provides an array substrate and a manufacturing method thereof to solve a technical issue that in a conventional technology, a metal etching solution corrodes an active layer to affect electrical conduction between source and drain electrodes and an active layer.

The embodiment of the present application provides an array substrate comprising:
an underlay;
an active layer disposed on the underlay;
a gate electrode insulation layer, wherein the gate electrode insulation layer is disposed on the active layer and covers the active layer, the gate electrode insulation layer comprises a first through hole set and a second through hole set disposed oppositely; wherein the first through hole set comprises a first through hole and second through holes, the second through holes are defined in a side of the first through hole set near the second through hole set, the second through hole set comprises third through holes and a fourth through hole, the third through holes are defined in a side of the second through hole set near the first through hole set, and both the second through holes and the third through holes are plural; and
a metal layer disposed on the gate electrode insulation layer, wherein the metal layer comprises a source electrode, a drain electrode, and a gate electrode, the drain electrode is connected to the active layer through the first through hole, and the source electrode is connected to the active layer through the fourth through hole.

Optionally, in some embodiments of the present application, the active layer comprises a channel region and a conductor region disposed on two sides of the channel region, the channel region is disposed to correspond to the gate electrode, the conductor region comprises a first conductor sub-region and a second conductor sub-region, the first conductor sub-region is disposed to correspond to the first through hole set, and the second conductor sub-region is disposed to correspond to the second through hole set.

Optionally, in some embodiments of the present application, the first through hole communicates with the second through holes.

Optionally, in some embodiments of the present application, a number of the first through hole is one, and the first through hole communicates with the second through holes.

Optionally, in some embodiments of the present application, the first through hole comprises a first side and a second side disposed oppositely; the first side and the second side are disposed along a direction from the first through hole set to the second through hole set, and a distance between the first side and the second through hole near the first side is less than or equal to 1 micron, a distance between the second side and the second through hole near the second side is less than or equal to 1 micron.

Optionally, in some embodiments of the present application, a number of the first through hole is more than one, and the first through holes correspond to and communicate with the second through holes respectively.

Optionally, in some embodiments of the present application, the third through holes communicate with the fourth through hole.

Optionally, in some embodiments of the present application, a number of the fourth through hole is one, and the fourth through hole communicates with the third through holes.

Optionally, in some embodiments of the present application, the fourth through hole comprises a third side and a fourth side disposed oppositely; the third side and the fourth side are disposed along a direction from the first through hole set to the second through hole set, a distance between the third side and the third through holes near the third side is less than or equal to 1 micron, and a distance between the fourth side and the third through holes near the fourth side is less than or equal to 1 micron.

Optionally, in some embodiments of the present application, a number of the fourth through hole is more than one, and the third through holes correspond to and communicate with the fourth through holes respectively.

Optionally, in some embodiments of the present application, a first interval is defined between the first through hole and the second through holes, and the first interval is less than or equal to 2 microns; a second interval is defined between the third through holes and the fourth through hole, and the second interval is less than or equal to 2 microns.

Optionally, in some embodiments of the present application, an interval between adjacent ones of the second through holes is 2 microns to 3 microns, and an interval between adjacent ones of the third through holes is 2 microns to 3 microns.

Optionally, in some embodiments of the present application, a width of the second through hole is 2 microns to 5 microns, and a width of the third through hole is 2 microns to 5 microns.

Optionally, in some embodiments of the present application, a length of the second through hole is 10 microns to 30 microns, and a length of the third through hole is 10 microns to 30 microns.

Optionally, in some embodiments of the present application, the array substrate further comprises a light shielding layer and a buffer layer, the light shielding layer is disposed on the underlay, and the buffer layer is disposed between the light shielding layer and the active layer.

Optionally, in some embodiments of the present application, the array substrate further comprises a passivation layer, the passivation layer is disposed on the metal layer, a via hole is defined in the passivation layer, and the via hole extends through the passivation layer to expose the source electrode.

Optionally, in some embodiments of the present application, a material of the passivation layer is silicon dioxide, nitrogen dioxide, silicon oxynitride, or acrylic.

Optionally, in some embodiments of the present application, a connection hole is further defined in the gate electrode insulation layer, and the source electrode extends into the connection hole.

Optionally, in some embodiments of the present application, a shape of the second through hole is rectangular, polyline-shaped, wave-shaped, or arc-shaped, and a shape of the third through hole is rectangular, polyline-shaped, wave-shaped, or arc-shaped.

Accordingly, the present application further comprises an array substrate manufacturing method, the manufacturing method comprises:

providing an underlay;

forming an active layer on the underlay;

forming a gate electrode insulation layer on the active layer, wherein the gate electrode insulation layer covers the active layer;

defining a first through hole set and a second through hole set disposed oppositely in the gate electrode insulation layer; wherein the first through hole set comprises a first through hole and second through holes, the second through holes are defined in a side of the first through hole set near the second through hole set, the second through hole set comprises third through holes and a fourth through hole, the third through holes are defined in a side of the second through hole set near the first through hole set, and both the second through holes and the third through holes are plural; and forming a metal layer on the gate electrode insulation layer, wherein the metal layer comprises a source electrode, a drain electrode, and a gate electrode, the drain electrode is connected to the active layer through the first through hole, and the source electrode is connected to the active layer through the fourth through hole.

The embodiment of the present application employs an array substrate and a manufacturing method thereof. The array substrate comprises an underlay, an active layer, gate electrode insulation layer and metal layer. A first through hole set and a second through hole set are disposed oppositely on the gate electrode insulation layer. The first through hole set comprises a first through hole and second through holes. The second through holes are defined on a side of the first through hole set near the second through hole set. The second through hole set comprises a third through holes and a fourth through hole. The third through holes are defined in a side of the second through hole set near first through hole set. Both numbers of the second through holes and the third through holes are plural. The second through holes and third through holes are arranged at intervals such that partial regions of the first conductor sub-region and the second conductor sub-region are shielded by the gate electrode insulation layer to prevent the regions from corrosion of etching solution such that a width of an electrical connection channel between the active layer and the source electrode and the drain electrode is increased and normal electrical connection between the active layer and the source electrode and the drain electrode is guaranteed, which enhances an electrical performance of the array substrate and improves a yield rate of the array substrate.

BRIEF DESCRIPTION OF THE SEVERAL VIEWS OF THE DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DESCRIPTION OF SPECIFIC EMBODIMENTS OF THE INVENTION

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

In the description of the present application, it should be understood that terminologies "length", "width", "thickness", "upper", "lower" for indicating relations of orientation or position are based on orientation or position of the accompanying drawings, are only for the purposes of facilitating description of the present application and simplifying the description instead of indicating or implying that the referred device or element must have a specific orientation or position, must to be structured and operated with the specific orientation or position. Therefore, they should not be understood as limitations to the present application. In the description of the present application, a meaning of "a plurality of" is two or more, unless there is a clear and specific limitation otherwise.

In the description of the present application, terminologies "first", "second" are only for the purposes of description, and cannot be understood as indication or implication of comparative importance or a number of technical features. Therefore, a feature limited with "first", "second" can expressly or implicitly include one or more features.

An embodiment of the present application provides an array substrate and an array substrate. Respective descriptions are as follows. It should be explained that description of the order of embodiments has no limit to priority order of the embodiments.

Figure 1:
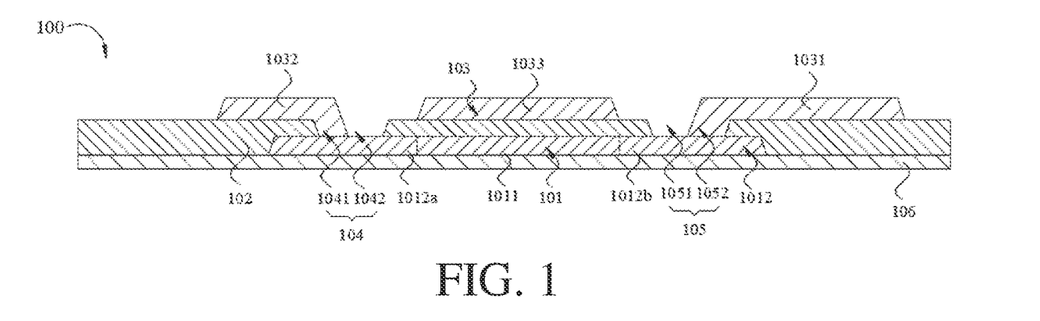
FIG. 1 is a first schematic structural view of an array substrate provided by an embodiment of the present application.
Figure 2:
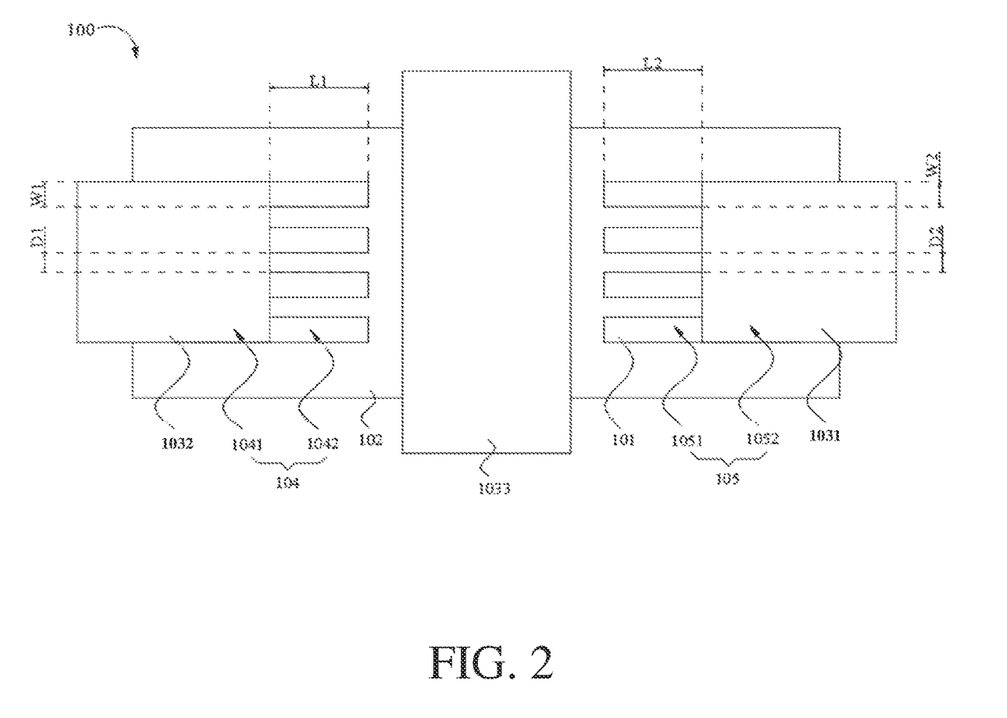
FIG. 2 is a top view of the array substrate provided by the embodiment of the present application.

With reference to FIGS. 1 and 2, FIG. 1 is a first schematic structural view of an array substrate provided by an embodiment of the present application, and FIG. 2 is a top view of the array substrate provided by the embodiment of the present application. With reference to FIGS. 1 and 2, the array substrate 100 provided by the embodiment of the present application comprises an active layer 101, a gate electrode insulation layer 102, a metal layer 103, and an underlay 106. The active layer 101 is disposed on the underlay 106, and the gate electrode insulation layer 102 is disposed on the active layer 101 and covers the active layer 101. The gate electrode insulation layer 102 comprises a first through hole set 104 and a second through hole set 105 disposed oppositely. The first through hole set 104 comprises a first through hole 1041 and second through holes 1042. The second through holes 1042 are defined in a side of the first through hole set 104 near the second through hole set 105. The second through hole set 105 comprises third through holes 1051 and a fourth through hole 1052. The third through holes 1051 are defined in a side of the second through hole set 105 near the first through hole set 104. Both the second through holes 1042 and the third through holes 1051 are plural. The metal layer 103 is disposed on the gate electrode insulation layer 102. The metal layer 103 comprises a source electrode 1031, a drain electrode 1032, and a gate electrode 1033. The drain electrode 1032 is connected to the active layer 101 through the first through hole 1041. The source electrode 1031 is connected to the active layer 101 through the fourth through hole 1052.

The active layer 101 comprises a channel region 1011 and a conductor region 1012 disposed on two sides of the channel region 1011. The channel region 1011 is disposed to correspond to the gate electrode 1033. The conductor region 1012 comprises a first conductor sub-region 1012a and a second conductor sub-region 1012b. The first conductor sub-region 1012a is disposed to correspond to the first through hole set 104. the second conductor sub-region 1012b is disposed to correspond to the second through hole set 105.

It should be explained that a material of the source electrode 1031 and the drain electrode 1032 is a metal material of a low impedance. The source electrode 1031 and the drain electrode 1032 can only be formed by a wet etching process. In a conventional technology, when the source electrode and the drain electrode is formed by the wet etching process, etching solution would corrode the active layer to reduce an electrical connection performance between the active layer and source electrode and an electrical connection performance between the active layer and the drain electrode.

It should be explained that the after a hole definition operation is made in the gate electrode insulation layer 102, the conductor region 1012 would be metalized by a conductorization process. Specifically, the embodiment of the present application conductorizes the conductor region 1012 by an ion doping process. Although the conductorization process can only be performed by injecting ions into the second through holes 1042 and the third through holes 1051, the conductorization process has a certain diffusion distance, and therefore the conductor region 1012 can be completely conductorized.

Furthermore, when the source electrode 1031 is formed by the wet etching process, and a portion of the second conductor sub-region 1012b shielded by the gate electrode insulation layer 102 would not be corroded by the etching solution such that a width of an electrical connection channel between the active layer 101 and the source electrode 1031 is increased to guarantee a normal electrical connection between the active layer 101 and the source electrode 1031. When the drain electrode 1032 is formed by the wet etching process, a portion of the first conductor sub-region 1012a shielded by the gate electrode insulation layer 102 would not be corroded by the etching solution, thereby increasing a width of an electrical connection channel between the active layer 101 and the drain electrode 1032 and guaranteeing a normal electrical connection between the active layer 101 and the drain electrode 1032. Therefore, the second through holes 1042 and the third through holes 1051 provided by the embodiment of the present application can improve an electrical performance of the array substrate 100 to improve a yield rate of the array substrate 100.

An interval D1 of adjacent ones of the second through holes 1042 is 2 microns to 3 microns. Specifically, the interval D1 of adjacent ones of the second through holes 1042 is 2 microns, 2.1 microns, 2.2 microns, 2.4 microns, 2.6 microns, 2.8 microns, or 3 microns. A specific interval D1 of adjacent ones of the second through holes 1042 is determined by process requirements of the array substrate 100.

It should be explained that the diffusion distance of the conductorization process is greater than 1 micron. To guarantee that the active layer 101 shielded by the gate electrode insulation layer 102 between adjacent ones of the second through holes 1042 can be metalized, the interval D1 of adjacent ones of the second through holes 1042 is defined as 2 microns to 3 microns.

An interval D2 of adjacent ones of the third through holes 1051 is 2 microns to 3 microns. Specifically, the interval D2 of adjacent ones of the third through holes 1051 is 2 microns, 2.1 microns, 2.2 microns, 2.4 microns, 2.6 microns, 2.8 microns, or 3 microns. A specific interval D2 of adjacent ones of the third through holes 1051 is determined by the process requirements of the array substrate 100.

It should be explained that the diffusion distance of the conductorization process is greater than 1 micron. To guarantee that the active layer 101 shielded by the gate electrode insulation layer 102 between the third through holes 1051 can be metalized, the interval D2 between adjacent ones of the third through holes 1051 is defined as 2 microns to 3 microns.

A width W1 of the second through hole 1042 is 2 microns to 5 microns. Specifically, the width W1 of the second through hole 1042 is 2 microns, 2.2 microns, 2.4 microns, 2.8 micron, 3.2 microns, 4 microns, or 5 microns. A specific width W1 of the second through hole 1042 is determined by the process requirements of the array substrate 100.

It should be explained that the a distance between the second through holes 1042 on two sides is constant. Therefore, reducing the width W1 of the second through hole 1042 can increase a width of the active layer 101 covered by the gate electrode insulation layer 102 and therefore increase the width of the electrical connection channel between the active layer 101 and the drain electrode 1032 to guarantee the normal electrical connection between the active layer 101 and the drain electrode 1032.

A width W2 of the third through hole 1051 is 2 microns to 5 microns. Specifically, the width W2 of the third through hole 1051 is 2 microns, 2.2 microns, 2.4 microns, 2.8 microns, 3.2 microns, 4 micron, or 5 microns. A specific width W2 of the third through hole 1051 is determined by the process requirements of the array substrate 100.

It should be explained that the a distance between the third through holes 1051 on two sides is constant. Therefore, reducing the width W2 of the third through holes 1051 can increase the width of the active layer 101 covered by the gate electrode insulation layer 102 and therefore increase the width of the electrical connection channel between the active layer 101 and the source electrode 1031 to guarantee the normal electrical connection between the active layer 101 and the source electrode 1031.

It should be explained that the source electrode 1031 and the drain electrode 1032 are disposed on two sides of the gate electrode 1033 respectively. Specific locations of the source electrode 1031 and the drain electrode 1032 are determined by the process requirements of the array substrate 100.

Both the second through holes 1042 and the third through holes 1051 are disposed along a direction from the first through hole set 104 to the second through hole set 105. Specifically, the second through holes 1042 and the third through holes 1051 are disposed along a direction from a center of the first through hole set 104 to a center of the second through hole set 105. It should be explained that an employment of above configuration can reduce a difficulty of processes and therefore achieve a cost lowering effect.

A length L1 of the second through hole 1042 is 10 microns to 30 microns. Specifically, the length L1 of the second through hole 1042 is 10 microns, 12 microns, 15 microns, 18 microns, 22 microns, 26 micron, or 30 microns. A specific length L1 of the second through hole 1042 is determined by the process requirements of the array substrate 100.

A length L2 of the third through hole 1051 is 10 microns to 30 microns. Specifically, the length L2 of the third through hole 1051 is 10 microns, 12 microns, 15 microns, 18 microns, 22 microns, 26 micron, or 30 microns. A specific length L2 of the third through hole 1051 is determined by the process requirements of the array substrate 100.

It should be explained that a material of the active layer 101 is low temperature polysilicon or a metal oxide semiconductor material. Specifically, the material of the active layer 101 is indium gallium zinc oxide, indium gallium zinc tin oxide, indium zinc oxide, or zinc indium oxide. A specific material of the active layer 101 is determined by the process requirements of the array substrate 100. A material of the gate electrode insulation layer 102 is silicon dioxide, nitrogen dioxide, or silicon oxynitride. A specific material of the gate electrode insulation layer 102 is determined by the process requirements of the array substrate 100. A material of the metal layer 103 is a metal material of a low impedance. Specifically, the material of the metal layer 103 is copper or silver. A specific material of the metal layer 103 is determined by the process requirements of the array substrate 100.

Shapes of the second through holes 1042 and the third through holes 1051 are rectangular, polyline-shaped, wave-shaped, or arc-shaped. Specific shapes of the second through holes 1042 and the third through holes 1051 are determined by the process requirements of the array substrate 100.

Figure 3:
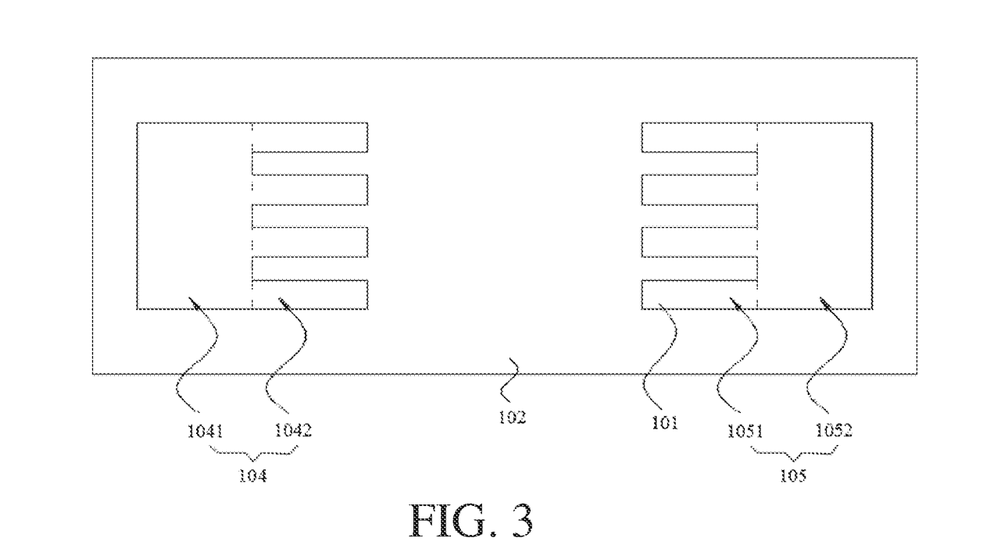
FIG. 3 is a first top view of the array substrate provided by the embodiment of the present application after through holes are formed.

With reference to FIG. 3, FIG. 3 is a first top view of the array substrate provided by the embodiment of the present application after through holes are formed. As shown in FIG. 3, a number of each of the first through hole 1041 and each of the fourth through hole 1052 is one. The first through hole 1041 communicates with the second through holes 1042, and the fourth through hole 1052 communicates with the third through holes 1051.

It should be explained that the first through hole 1041 is only one, and an overlap area between the active layer 101 and the drain electrode 1032 can be increased to improve the electrical performance of the array substrate 100. The fourth through hole 1052 is only one, and an overlap area between the active layer 101 and the source electrode 1031 can be increased to improve the electrical performance of the array substrate 100.

Figure 4:
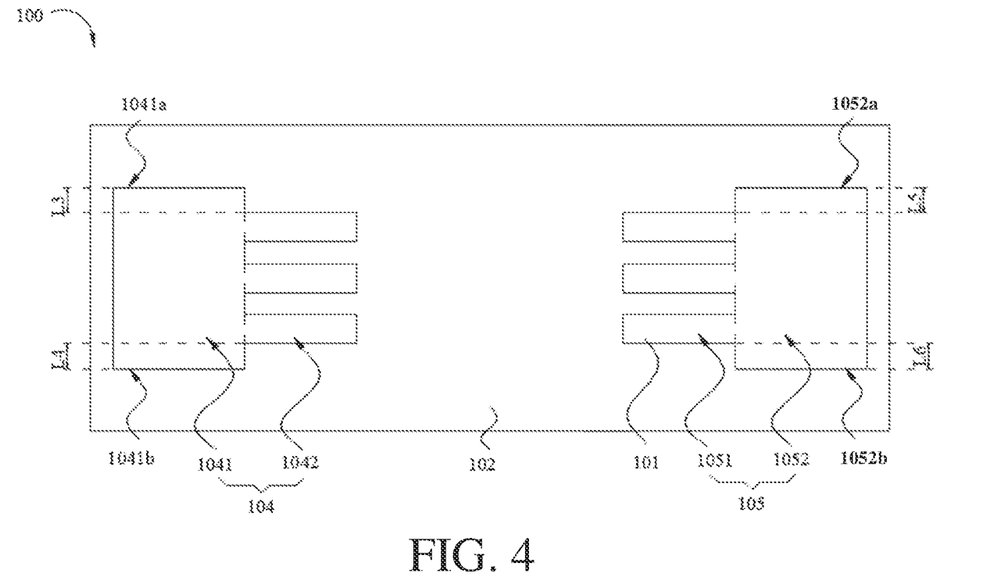
FIG. 4 is a second top view of the array substrate provided by the embodiment of the present application after the through holes are formed.

With reference to FIG. 4, FIG. 4 is a second top view of the array substrate provided by the embodiment of the present application after the through holes are formed. As shown in FIG. 4, a difference of the array substrate 100 as shown in FIG. 4 from the array substrate 100 as shown in FIG. 3 is that the first through hole 1041 comprises a first side 1041a and a second side 1041b disposed oppositely. The fourth through hole 1052 comprises a third side 1052a and a fourth side 1052b disposed oppositely. The first side 1041a, the second side 1041b, the third side 1052a, and the fourth side 1052b are disposed along the direction of the first through hole set 104 to the second through hole set 105. A distance L3 between the first side 1041a and the ones of the second through holes 1042 near the first side 1041a is less than or equal to 1 micron. A distance L4 between the second side 1041b and the ones of the second through holes 1042 near the second side 1041b is less than or equal to 1 micron. A distance L5 between the third side 1052a and the third through holes 1051 near the third side 1052a is less than or equal to 1 micron. A distance L6 between the fourth side 1052b and the third through holes 1051 near the fourth side 1052b is less than or equal to 1 micron.

It should be explained that the distance L3 is defined between the first side 1041a and the second through holes 1042 near the first side 1041a. An interval L4 is defined between the second side 1041b and the second through holes 1042 near the second side 1041b. An employment of above configuration can reduce a width of the second through hole 1042, thereby increasing the width of the electrical connection channel between the active layer 101 and the drain electrode 1032 to guarantee the normal electrical connection between the active layer 101 and the drain electrode 1032. The employment of the above configuration can reduce the width of the second through holes 1042, thereby increasing the width of the electrical connection channel between the active layer 101 and the drain electrode 1032 to guarantee the normal electrical connection between the active layer 101 and the drain electrode 1032.

It should be explained that an interval L4 is defined between the third side 1052a and the third through holes 1051 near the third side 1052a. An interval L5 is defined between the fourth side 1052b and the third through holes 1051 near the fourth side 1052b. An employment of above configuration can reduce a width of the third through hole 1051 thereby increasing the width of the electrical connection channel between the active layer 101 and the source electrode 1031 to guarantee the normal electrical connection between the active layer 101 and the source electrode 1031. The employment of the above configuration can reduce the width of the third through hole 1051, thereby increasing the width of the electrical connection channel between the active layer 101 and the source electrode 1031 to guarantee the normal electrical connection between the active layer 101 and the source electrode 1031.

Each of the L3, L4, L5, and L6 is less than or equal to 1 micron. Specifically, The L3 is 0 microns, 0.1 microns, 0.2 microns, 0.3 microns, 0.5 microns, 0.7 microns, or 1 micron. The L4 is 0 microns, 0.1 microns, 0.2 microns, 0.3 microns, 0.5 microns, 0.7 microns, or 1 micron. The L5 is 0 microns, 0.1 microns, 0.2 microns, 0.3 microns, 0.5 microns, 0.7 microns, or 1 micron. The L6 is 0 microns, 0.1 microns, 0.2 microns, 0.3 microns, 0.5 microns, 0.7 microns, or 1 micron. Specific values of the L3, L4, L5, and L6 is determined by the process requirements of the array substrate 100.

It should be explained that the diffusion distance of the conductorization process is greater than 1 micron. To guarantee that the active layer 101 located on two sides of the second through holes 1042 on an outermost side can be metalized, both the L3 and the L4 are defined to be less than or equal to 1 micron. To guarantee that the active layer 101 on two sides of the third through holes 1051 on an outermost side can be metalized, both the L5 and the L6 are defined to be less than or equal to 1 micron.

Figure 5:
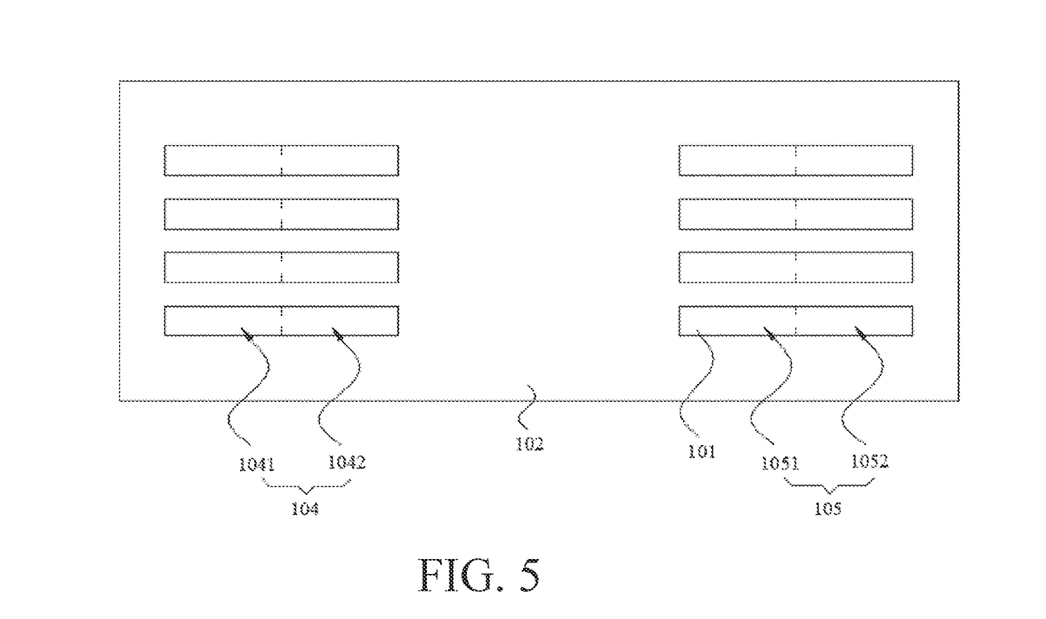
FIG. 5 is a third top view of the array substrate provided by the embodiment of the present application after the through holes are formed.

With reference to FIG. 5, FIG. 5 is a third top view of the array substrate provided by the embodiment of the present application after the through holes are formed. A difference of the array substrate 100 as shown in FIG. 5 from the array substrate 100 as shown in FIG. 3 is that both numbers of the first through hole 1041 and the fourth through hole 1052 are plural. The first through holes 1041 correspond to and communicate with the second through holes 1042 respectively. The third through holes 1051 correspond to and communicate with the fourth through holes 1052 respectively.

It should be explained that the first through holes 1041 correspond to and communicate with the second through holes 1042 respectively. First, an employment of above configuration can increase an overlap area between the active layer 101 and the drain electrode 1032 to improve the electrical performance of the array substrate 100. Second, the employment of the above configuration can prevent that the active layer 101 between the first through holes 1041 and the second through holes 1042 is not metalized to avoid a phenomenon that the drain electrode 1032 is unable to be electrically connected to the active layer 101.

It should be explained that the third through holes 1051 correspond to and communicate with the fourth through holes 1052. First, an employment of above configuration can increase an overlap area between the active layer 101 and the source electrode 1031 to improve the electrical performance of the array substrate 100. Second, the employment of the above configuration can prevent that the active layer 101 between the third through holes 1051 and the fourth through holes 1052 is not metalized to avoid that the source electrode 1031 is unable to be electrically connected to the active layer 101.

Figure 6:
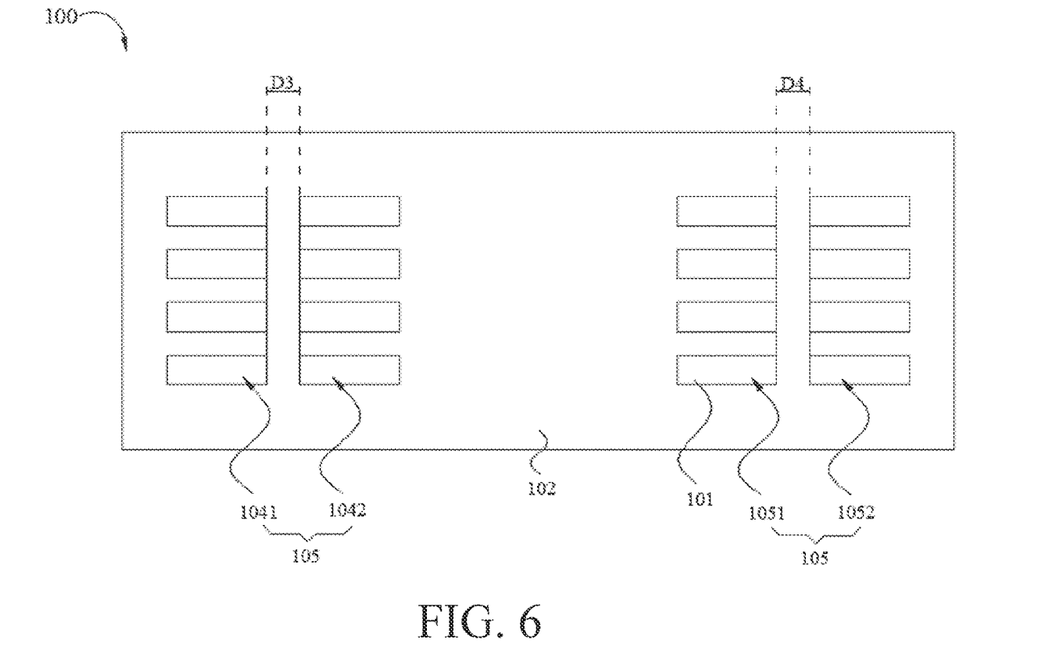
FIG. 6 is a fourth top view of the array substrate provided by the embodiment of the present application after the through holes are formed.

With reference to FIG. 6, FIG. 6 is a fourth top view of the array substrate provided by the embodiment of the present application after the through holes are formed. A difference of the array substrate 100 as shown in FIG. 6 from the array substrate 100 as shown in FIG. 5 is that a first interval D3 is defined between the first through hole 1041 and the second through holes 1042, and the first interval D3 is less than or equal to 2 microns. A second interval D4 is defined between the third through holes 1051 and the fourth through hole 1052, and the second interval D4 is less than or equal to 2 microns.

It should be explained that because the first interval D3 is defined between the first through hole 1041 and the second through holes 1042, therefore, the active layer 101 between the first through hole 1041 and the second through holes 1042 is covered by the gate electrode insulation layer 102 and would not be influenced by the etching solution. The conductorization process has the certain diffusion distance. Therefore, the active layer 101 between the first through hole 1041 and the second through holes 1042 can be metalized to increase the width of the electrical connection channel between the active layer 101 and the drain electrode 1032 to guarantee the normal electrical connection between the active layer 101 and the drain electrode 1032.

It should be explained that the because the second interval D4 is defined between the third through holes 1051 and the fourth through hole 1052, the active layer 101 between the third through holes 1051 and the fourth through hole 1052 is covered by the gate electrode insulation layer 102 and would not be influenced by the etching solution. The conductorization process has the certain diffusion distance. Therefore, the active layer 101 between the third through holes 1051 and the fourth through hole 1052 can be metalized to increase the width of the electrical connection channel between the active layer 101 and the source electrode 1031 to guarantee the normal electrical connection between the active layer 101 and the source electrode 1031.

The first interval D3 and the second interval D4 are less than or equal to 2 microns. Specifically, the first interval D3 is 0.1 microns, 0.2 microns, 0.4 microns, 0.8 microns, 1.2 microns, 1.6 microns, or 2 microns. The second interval D4 is 0.1 microns, 0.2 microns, 0.4 microns, 0.8 microns, 1.2 microns, 1.6 microns, or 2 microns. Specific values of the first interval D3 and the second interval D4 are determined by the process requirements of the array substrate 100.

It should be explained that the diffusion distance of the conductorization process is greater than 1 micron. To guarantee that the active layer 101 between the first through hole 1041 and the second through holes 1042 can be metalized, the first interval D3 is defined to be less than or equal to 2 microns. To guarantee that the active layer 101 between the third through holes 1051 and the fourth through hole 1052 can be metalized, the second interval D4 is defined to be less than or equal to 2 microns.

Figure 7:
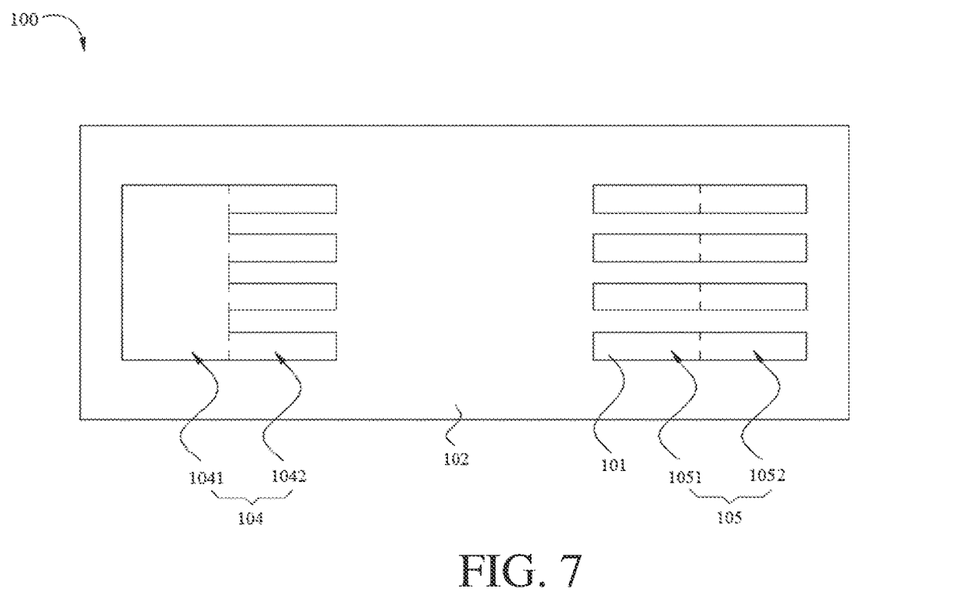
FIG. 7 is a fifth top view of the array substrate provided by the embodiment of the present application after the through holes are formed.

With reference to FIG. 7, FIG. 7 is a fifth top view of the array substrate provided by the embodiment of the present application after the through holes are formed. A difference of the array substrate 100 as shown in FIG. 7 from the array substrate 100 as shown in FIG. 3 is that a number of the fourth through hole 1052 is more than one. The fourth through hole 1052 is disposed along the direction from the first through hole set 104 to the second through hole set 105. The third through holes 1051 correspond to and communicate with the fourth through holes 1052 respectively.

It should be explained that disposing of the first through hole set 104 would not affect disposing of the second through hole set 105. At the same time, the disposing of the second through hole set 105 also would not affect the disposing of the first through hole set 104.

Figure 8:
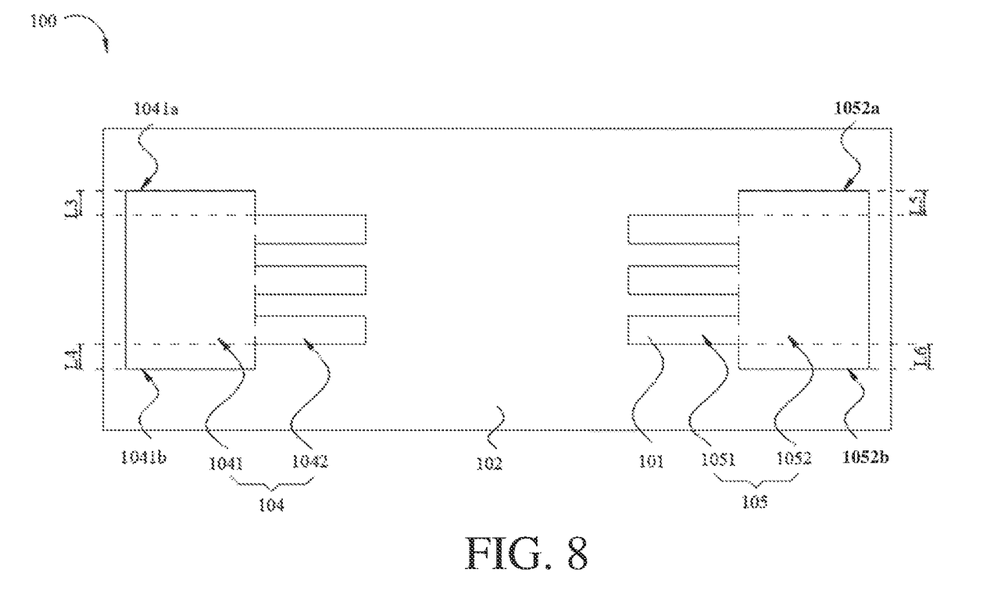
FIG. 8 is a sixth top view of the array substrate provided by the embodiment of the present application after the through holes are formed.

With reference to FIG. 8, FIG. 8 is a sixth top view of the array substrate provided by the embodiment of the present application after the through holes are formed. A difference of the array substrate 100 as shown in FIG. 8 from the array substrate 100 as shown in FIG. 3 is that the fourth through hole 1052 comprises the third side 1052a and the fourth side 1052b disposed oppositely. Both the third side 1052a and the fourth side 1052b are disposed along the direction from the first through hole set 104 to the second through hole set 105. The distance L5 between the third side 1052a and the ones of the third through holes 1051 near the third side 1052a is less than or equal to 1 micron. The distance L6 between the fourth side 1052b and the ones of the third through holes 1051 near the fourth side 1052b is less than or equal to 1 micron.

It should be explained that the disposing of the first through hole set 104 would not affect the disposing of the second through hole set 105. At the same time, the disposing of the second through hole set 105 also would not affect the disposing of the first through hole set 104. Therefore, according to differences between the source electrode 1031 and the drain electrode 1032, a suitable one of the first through hole set 104 and the second through hole set 105 can be selected.

Figure 9:
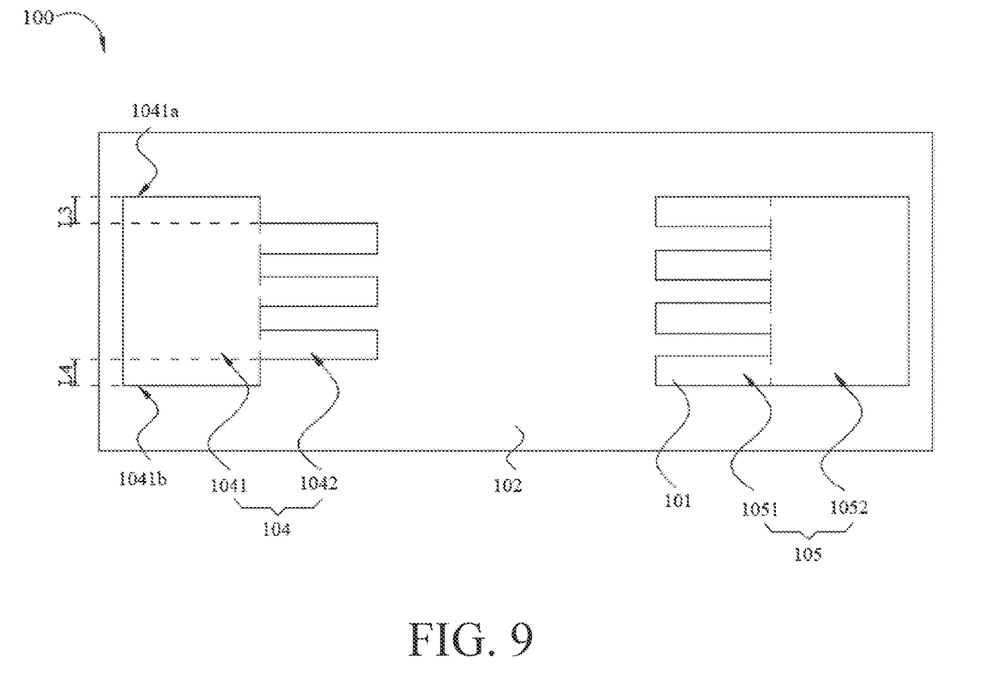
FIG. 9 is a seventh top view of the array substrate provided by the embodiment of the present application after the through holes are formed.

With reference to FIG. 9, FIG. 9 is a seventh top view of the array substrate provided by the embodiment of the present application after the through holes are formed. A difference of the array substrate 100 as shown in FIG. 9 from the array substrate 100 as shown in FIG. 4 is that the number of the fourth through hole 1052 is one, and the fourth through hole 1052 communicates with the third through holes 1051.

It should be explained that the disposing of the first through hole set 104 would not affect the disposing of the second through hole set 105. At the same time, the disposing of the second through hole set 105 also would not affect the disposing of the first through hole set 104. Therefore, according to the differences between the source electrode 1031 and the drain electrode 1032, the suitable one of the first through hole set 104 and the second through hole set 105 can be selected.

Figure 10:
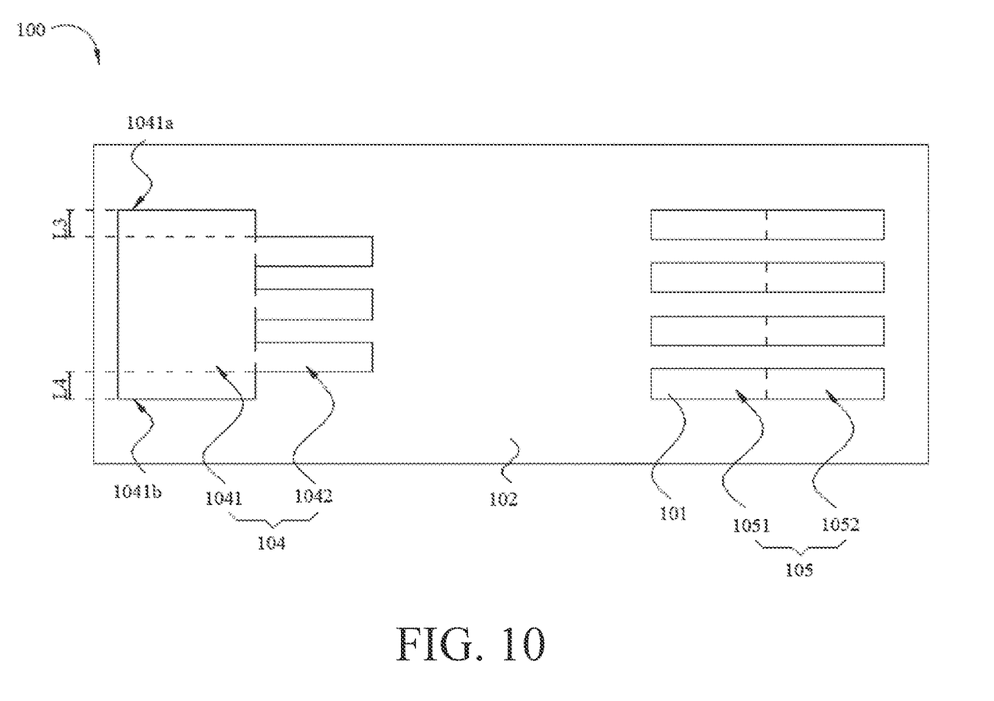
FIG. 10 is an eighth top view of the array substrate provided by the embodiment of the present application after the through holes are formed.

With reference to FIG. 10, FIG. 10 is an eighth top view of the array substrate provided by the embodiment of the present application after the through holes are formed. A difference of the array substrate 100 as shown in FIG. 10 from the array substrate 100 as shown in FIG. 4 is that the number of the fourth through hole 1052 is more than one. The fourth through hole 1052 is disposed along the direction from the first through hole set 104 to the second through hole set 105. The third through holes 1051 correspond to and communicate with the fourth through holes 1052 respectively.

It should be explained that the disposing of the first through hole set 104 would not affect the disposing of the second through hole set 105. At the same time, the disposing of the second through hole set 105 also would not affect the disposing of the first through hole set 104. Therefore, according to the differences between the source electrode 1031 and the drain electrode 1032, the suitable one of the first through hole set 104 and the second through hole set 105 can be selected.

Figure 11:
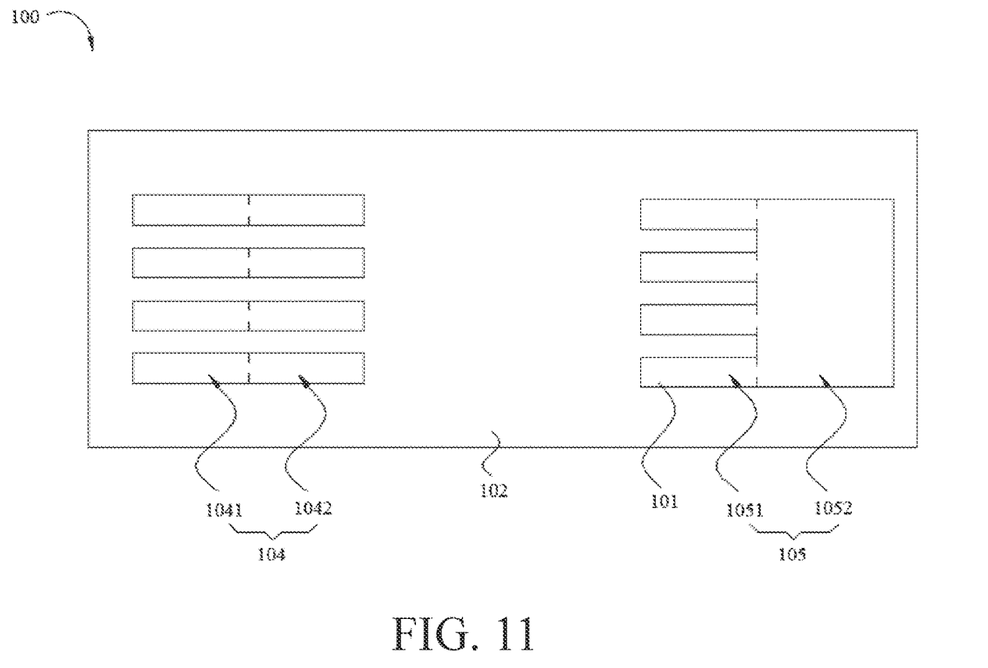
FIG. 11 is a ninth top view of the array substrate provided by the embodiment of the present application after the through holes are formed.

With reference to FIG. 11, FIG. 11 is a ninth top view of the array substrate provided by the embodiment of the present application after the through holes are formed. as shown in FIG. 11. A difference of the array substrate 100 as shown in FIG. 11 from the array substrate 100 as shown in FIG. 5 is that the number of the fourth through hole 1052 is one, and the fourth through hole 1052 communicates with the third through holes 1051.

It should be explained that the disposing of the first through hole set 104 would not affect the disposing of the second through hole set 105. At the same time, the disposing of the second through hole set 105 also would not affect the disposing of the first through hole set 104. Therefore, according to the differences between the source electrode 1031 and the drain electrode 1032, the suitable one of the first through hole set 104 and the second through hole set 105 can be selected.

Figure 12:
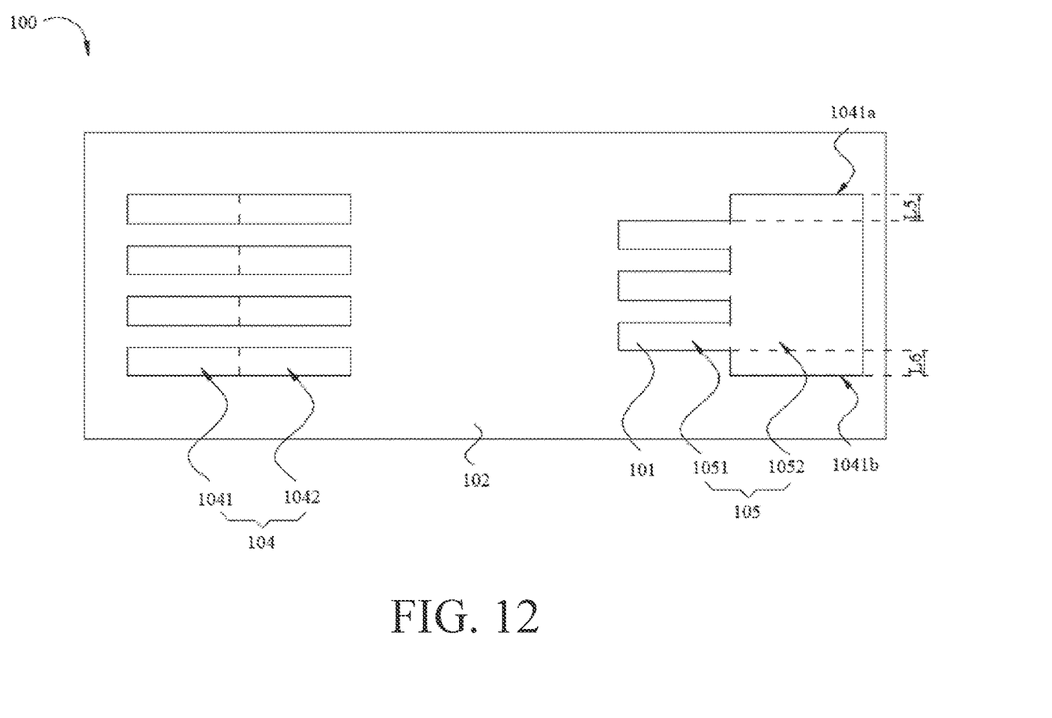
FIG. 12 is a tenth top view of the array substrate provided by the embodiment of the present application after the through holes are formed.

With reference to FIG. 12, FIG. 12 is a tenth top view of the array substrate provided by the embodiment of the present application after the through holes are formed. As shown in FIG. 12. A difference of the array substrate 100 as shown in FIG. 12 from the array substrate 100 as shown in FIG. 5 is that the fourth through hole 1052 comprises the third side 1052a and the fourth side 1052b disposed oppositely. Both the third side 1052a and the fourth side 1052b are disposed along the direction from the first through hole set 104 to the second through hole set 105. A distance L5 between the third side 1052a and the ones of the third through holes 1051 near the third side 1052a is less than or equal to 1 micron. A distance L6 between the fourth side 1052b and the ones of the third through holes 1051 near the fourth side 1052b is less than or equal to 1 micron.

It should be explained that the disposing of the first through hole set 104 would not affect the disposing of the second through hole set 105. At the same time, the disposing of the second through hole set 105 also would not affect the disposing of the first through hole set 104. Therefore, according to the differences between the source electrode 1031 and the drain electrode 1032, the suitable one of the first through hole set 104 and the second through hole set 105 can be selected.

Figure 13:
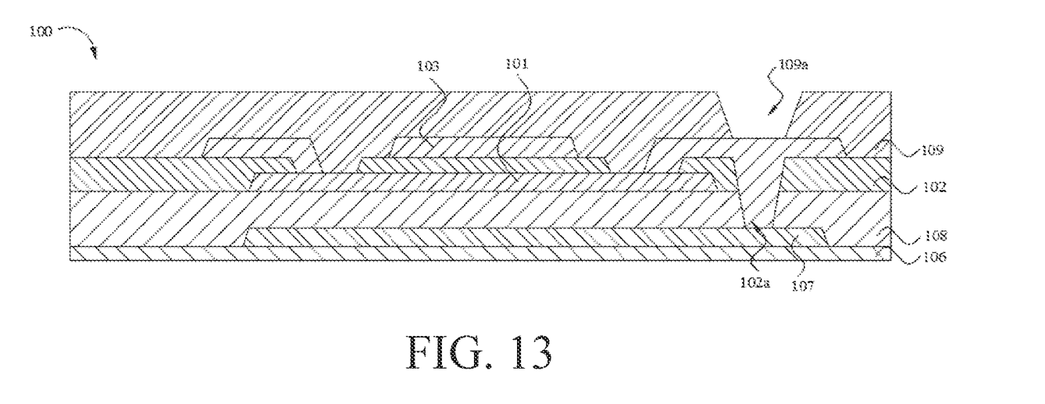
FIG. 13 is a second schematic structural view of the array substrate provided by the embodiment of the present application.

With reference to FIG. 13, FIG. 13 is a second schematic structural view of the array substrate provided by the embodiment of the present application. As shown in FIG. 13, the array substrate 100 provided by the embodiment of the present application further comprises a light shielding layer 107, a buffer layer 108, and a passivation layer 109.

The light shielding layer 107 is disposed on the underlay 106. The buffer layer 108 is disposed on the light shielding layer 107 and covers the light shielding layer 107. The active layer 101 is disposed on the buffer layer 108. The passivation layer 109 is disposed on the metal layer 103, and a via hole 109a is defined in the passivation layer 109. The via hole 109a extends through the passivation layer 109 to expose the layer of the source electrode 1031. A connection hole 102a is further defined in the gate electrode insulation layer 102, and the source electrode 1031 extends into the connection hole 102a.

An above embodiment has described the array substrate 100 in detail. Therefore, in the embodiment of the present application, the array substrate 100 is not described repeatedly too much.

It should be explained that the via hole 109a is configured to make the source electrode 1031 receive external electrical signals. Furthermore, the via hole 109a is disposed to correspond to the source electrode 1031. The connection hole 102a is configured to connect the source electrode 1031 to the light shielding layer 107.

It should be explained that the underlay 106 is a glass underlay or a plastic underlay. A material of the buffer layer 108 is silicon dioxide, nitrogen dioxide, or silicon oxynitride. A material of the passivation layer 109 is silicon dioxide, nitrogen dioxide, silicon oxynitride or acrylic resin.

In the array substrate provided by the embodiment of the present application, the array substrate comprises an underlay, an active layer, a gate electrode insulation layer, and a metal layer. A first through hole set and a second through hole set are defined oppositely on the gate electrode insulation layer. The first through hole set comprises a first through hole and second through holes. The second through holes are defined on a side of the first through hole set near the second through hole set. The second through hole set comprises a third through holes and a fourth through hole. The third through holes are defined in a side of the second through hole set near first through hole set. Both numbers of the second through holes and the third through holes are plural. The second through holes and third through holes are arranged at intervals such that partial regions of a first conductor sub-region and a second conductor sub-region are shielded by the gate electrode insulation layer to prevent the regions from corrosion of etching solution, such that a width of an electrical connection channel between the active layer and a source electrode and a drain electrode is increased and a normal electrical connection between the active layer and the source electrode and the drain electrode is guaranteed, which enhances an electrical performance of the array substrate and improves a yield rate of the array substrate.

Figure 14:
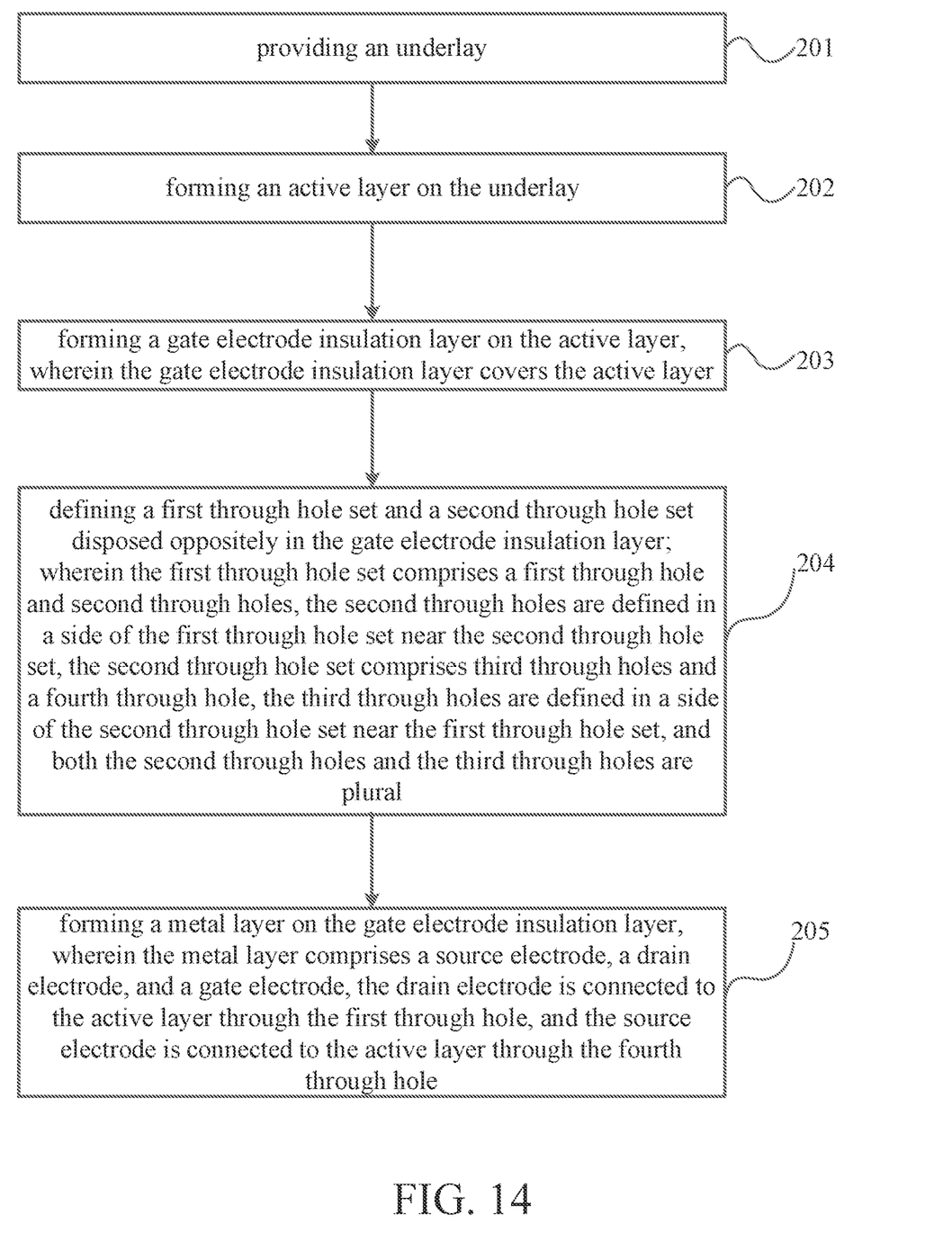
FIG. 14 is a schematic flowchart of an array substrate manufacturing method provided by the embodiment of the present application.

With reference to FIG. 14, FIG. 14 is a schematic flowchart of an array substrate manufacturing method provided by the embodiment of the present application. As shown in FIG. 14, the array substrate provided by the embodiment of the present application manufacturing method comprises steps as follows: step 201: providing an underlay.

Step 202: forming an active layer on the underlay.

Step 203: forming a gate electrode insulation layer on the active layer, wherein the gate electrode insulation layer covers the active layer.

Step 204: defining a first through hole set and a second through hole set disposed oppositely in the gate electrode insulation layer; wherein the first through hole set comprises a first through hole and second through holes, the second through holes are defined in a side of the first through hole set near the second through hole set, the second through hole set comprises third through holes and a fourth through hole, the third through holes are defined in a side of the second through hole set near the first through hole set, and both the second through holes and the third through holes are plural.

Step 205: forming a metal layer on the gate electrode insulation layer, wherein the metal layer comprises a source electrode, a drain electrode, and a gate electrode, the drain electrode is connected to the active layer through the first through hole, and the source electrode is connected to the active layer through the fourth through hole.

In the array substrate manufacturing method of the embodiment of the present application, the array substrate comprises an active layer, a gate electrode insulation layer, and a metal layer. A first through hole set and a second through hole set are defined oppositely on the gate electrode insulation layer. The first through hole set comprises a first through hole and second through holes. The second through holes are defined on a side of the first through hole set near the second through hole set. The second through hole set comprises third through holes and a fourth through hole. The third through holes are defined in a side of the second through hole set near the first through hole set. Both numbers of the second through holes and the third through holes are plural. The second through holes and the third through holes are arranged at intervals such that a partial region of the active layer is shielded by the gate electrode insulation layer to prevent the regions from corrosion of etching solution such that a width of an electrical connection channel between the active layer and the source electrode and the drain electrode is increased and a normal electrical connection between the active layer and the source electrode and the drain electrode is guaranteed, which enhances an electrical performance of the array substrate and improves a yield rate of the array substrate.

The array substrate and the manufacturing method thereof provided by the embodiment of the present application have been described in detail as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:
1. An array substrate, comprising:
 an underlay;
 an active layer disposed on the underlay;
 a gate electrode insulation layer, wherein the gate electrode insulation layer is disposed on the active layer and covers the active layer, the gate electrode insulation layer comprises a first through hole set and a second through hole set disposed oppositely; wherein the first through hole set comprises a first through hole and second through holes, the second through holes are defined in a side of the first through hole set near the second through hole set, the second through hole set comprises third through holes and a fourth through hole, the third through holes are defined in a side of the second through hole set near the first through hole set, and the second through holes and the third through holes each include a plurality of holes; and a metal layer disposed on the gate electrode insulation layer, wherein the metal layer comprises a source electrode, a drain electrode, and a gate electrode, the drain electrode is connected to the active layer through the first through hole, and the source electrode is connected to the active layer through the fourth through hole.

2. The array substrate according to claim 1, wherein the active layer comprises a channel region and a conductor region disposed on two sides of the channel region, the channel region is disposed to correspond to the gate electrode, the conductor region comprises a first conductor sub-region and a second conductor sub-region, the first conductor sub-region is disposed to correspond to the first through hole set, and the second conductor sub-region is disposed to correspond to the second through hole set.

3. The array substrate according to claim 1, wherein the first through hole communicates with the second through holes.

4. The array substrate according to claim 3, wherein a number of the first through hole is one, and the first through hole communicates with the second through holes.

5. The array substrate according to claim 4, wherein the first through hole comprises a first side and a second side disposed oppositely; the first side and the second side each extend along a direction from the first through hole set to the second through hole set, and a distance between the first side and the second through holes near the first side is less than or equal to 1 micron, a distance between the second side and the second through holes near the second side is less than or equal to 1 micron.

6. The array substrate according to claim 3, wherein a number of the first through hole is more than one, and the first through holes correspond to and communicate with the second through holes respectively.

7. The array substrate according to claim 1, wherein the third through holes communicate with the fourth through hole.

8. The array substrate according to claim 7, wherein a number of the fourth through hole is one, and the fourth through hole communicates with the third through holes.

9. The array substrate according to claim 8, wherein the fourth through hole comprises a third side and a fourth side disposed oppositely; the third side and the fourth side each extend along a direction from the first through hole set to the second through hole set, a distance between the third side and the third through holes near the third side is less than or equal to 1 micron, and a distance between the fourth side and the third through holes near the fourth side is less than or equal to 1 micron.

10. The array substrate according to claim 7, wherein a number of the fourth through hole is more than one, and the third through holes correspond to and communicate with the fourth through holes respectively.

11. The array substrate according to claim 1, wherein a first interval is defined between the first through hole and the second through holes, and the first interval is less than or equal to 2 microns; a second interval is defined between the third through holes and the fourth through hole, and the second interval is less than or equal to 2 microns.

12. The array substrate according to claim 1, wherein an interval between adjacent ones of the second through holes is 2 microns to 3 microns, and an interval between adjacent ones of the third through holes is 2 microns to 3 microns.

13. The array substrate according to claim 1, wherein a width of the second through holes is 2 microns to 5 microns, and a width of the third through holes is 2 microns to 5 microns.

14. The array substrate according to claim 1, wherein a length of the second through holes is 10 microns to 30 microns, and a length of the third through holes is 10 microns to 30 microns.

15. The array substrate according to claim 1, wherein the array substrate further comprises a light shielding layer and a buffer layer, the light shielding layer is disposed on the underlay, and the buffer layer is disposed between the light shielding layer and the active layer.

16. The array substrate according to claim 15, wherein the array substrate further comprises a passivation layer, the passivation layer is disposed on the metal layer, a via hole is defined in the passivation layer, and the via hole extends through the passivation layer to expose the source electrode.

17. The array substrate according to claim 16, wherein a material of the passivation layer is silicon dioxide, nitrogen dioxide, silicon oxynitride, or acrylic resin.

18. The array substrate according to claim 1, wherein a connection hole is further defined in the gate electrode insulation layer, and the source electrode extends into the connection hole.

19. The array substrate according to claim 1, wherein a shape of the second through holes is rectangular, polyline-shaped, wave-shaped, or arc-shaped, and a shape of the third through holes is rectangular, polyline-shaped, wave-shaped, or arc-shaped.

20. An array substrate manufacturing method, comprising:
providing an underlay;
forming an active layer on the underlay;
forming a gate electrode insulation layer on the active layer, wherein the gate electrode insulation layer covers the active layer;
defining a first through hole set and a second through hole set disposed oppositely in the gate electrode insulation layer; wherein the first through hole set comprises a first through hole and second through holes, the second through holes are defined in a side of the first through hole set near the second through hole set, the second through hole set comprises third through holes and a fourth through hole, the third through holes are defined in a side of the second through hole set near the first through hole set, and both the second through holes and the third through holes each include a plurality of holes; and
forming a metal layer on the gate electrode insulation layer, wherein the metal layer comprises a source electrode, a drain electrode, and a gate electrode, the drain electrode is connected to the active layer through the first through hole, and the source electrode is connected to the active layer through the fourth through hole.

* * * * *